(12) United States Patent
Pancholy et al.

(10) Patent No.: US 6,380,762 B1
(45) Date of Patent: Apr. 30, 2002

(54) MULTI-LEVEL PROGRAMMABLE VOLTAGE CONTROL AND OUTPUT BUFFER WITH SELECTABLE OPERATING VOLTAGE

(75) Inventors: Ashish Pancholy, Santa Clara; Gary A. Gibbs, San Jose, both of CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 08/824,634

(22) Filed: Mar. 27, 1997

(51) Int. Cl.[7] .......................................... H03K 19/0175
(52) U.S. Cl. .............................. 326/81; 326/62; 326/63; 326/68; 326/80
(58) Field of Search ............................... 326/37, 48–50, 326/62–63, 68, 75, 80–81; 327/544–545, 407–408; 307/80, 125

(56) References Cited

U.S. PATENT DOCUMENTS

| | | | | |
|---|---|---|---|---|
| 4,853,560 A | * | 8/1989 | Iwamura et al. ............... | 326/80 |
| 5,099,453 A | * | 3/1992 | Steele .......................... | 365/229 |
| 5,426,616 A | * | 6/1995 | Kajigaya et al. ............. | 327/544 |
| 5,532,618 A | * | 7/1996 | Hardee et al. ................ | 326/63 |
| 5,747,890 A | * | 5/1998 | Yin .............................. | 307/87 |

\* cited by examiner

Primary Examiner—Jon Santamauro
Assistant Examiner—Steven S. Paik
(74) Attorney, Agent, or Firm—Wagner, Murabiot & Hao LLP

(57) ABSTRACT

An integrated circuit device includes an input circuit; logic circuitry coupled to the input circuit; an output circuit coupled to the logic circuitry; and a select circuit coupled to the input circuit, output circuit and logic circuitry. The select circuit generates a select signal that causes the input circuit, output circuit and logic circuit to operate according to a first state or a second state. The output buffer is configured to receive the select signal which selects output buffer operation at the first state or the second state. The output buffer is also configured to maintain a constant slew rate while operating in either the first or second state.

11 Claims, 8 Drawing Sheets

MULTI-LEVEL PROGRAMMABLE VOLTAGE CONTROL AND OUTPUT BUFFER WITH SELECTABLE OPERATING VOLTAGE

FIELD OF THE INVENTION

The present invention relates generally to the area of integrated circuit devices, and more specifically to such devices capable of operating at a variety of different voltage levels.

BACKGROUND

Integrated circuit (IC) devices are usually supplied with one operating voltage that is common to all of the individual circuits within the device. In the past, most IC devices were designed to operate at 5.0 volts. Yet, there has always been a desire to operate IC devices at lower voltages (e.g., 3.3 volts) due to a substantially lower power dissipation as compared with the 5.0 volt operating voltage. Nevertheless, operating at lower operating voltages resulted in slower performance of ICs, despite lower power consumption. Therefore, there had previously been a design trade-off between lower power dissipation or higher performance.

As technology has advanced, IC designers are no longer restricted by the past speed constraints associated with using a lower voltage to operate ICs. At present, some of the most popular IC devices operate at 3.3 volts. However, many manufacturers continue to use 5.0 volts as the operating voltage for their ICs. Consequently, it is desirable for designers to configure ICs such that they are capable of operating at either 3.3 or 5.0 volts (or other operating voltages).

Current IC devices incorporate metal mask options or fuses, which are used to select between different operating voltages within each circuit of an IC device. One problem with IC devices that incorporate such means for selecting different operating voltages is that once a metal mask option is selected (or a fuse blown) there is no way to reconfigure the device to operate at another operating voltage. For example, once the 5.0 volt option is selected, there is no way to reconfigure a circuit within the IC device to operate at 3.3 volts. In addition, each internal circuit requires its own fuse or metal mask option, causing the verification of the IC device before manufacture to become a complex process.

In some IC circuits, such as output buffers, designing the circuit with multiple operating voltage capabilities can lead to diminished performance or noise problems. For example, output buffers designed for higher operating voltages (e.g., 5.0 volts) are too slow when operated at a lower voltages (e.g., 3.3 volts). In other words, more current is needed to drive the output buffer at the high operating voltage speeds than can be provided by the low voltage design. However, output buffers designed for use with low operating voltages generate unacceptable amounts of ground bounce (or noise) when operated at higher voltages. The ground bounce is caused by current generated by switching to the high voltage signal, which is greater than needed to drive the output buffer at the lower operating voltage. Therefore, means for controlling the speed and ground bounce of an output buffer that is capable of operating at different voltages is desired.

SUMMARY OF THE INVENTION

An integrated circuit device includes an input circuit; logic circuitry coupled to the input circuit; an output circuit coupled to the logic circuitry; and a select circuit coupled to the input circuit, output circuit and logic circuitry. The select circuit generates a select signal that causes the input circuit, output circuit and logic circuit to operate according to a first state or a second state. In one embodiment, the first and second states may correspond to different operating voltages.

According to a further embodiment, the select circuit includes a first switch circuit that generates a first signal which corresponds to the first state and a second switch circuit that generates a second signal that corresponds to the second state. In addition, the select circuit may include a logic circuit that produces the select signal by selecting either the first signal or the second signal.

According to another embodiment, the output buffer includes a first driving circuit, a second driving circuit, and an output pad coupled to the first driving circuit and the second driving circuit. The output buffer is configured to receive a data signal, a control signal, and the select signal. The select signal selects output buffer operation at the first state or the second state. The output buffer is also configured to maintain an approximately constant slew rate while operating in either the first or second state.

BRIEF DESCRIPTION OF THE DRAWINGS

The present invention is illustrated by way of example and not limitation in the figures of the accompanying drawings in which.

DETAILED DESCRIPTION

Figure 1:
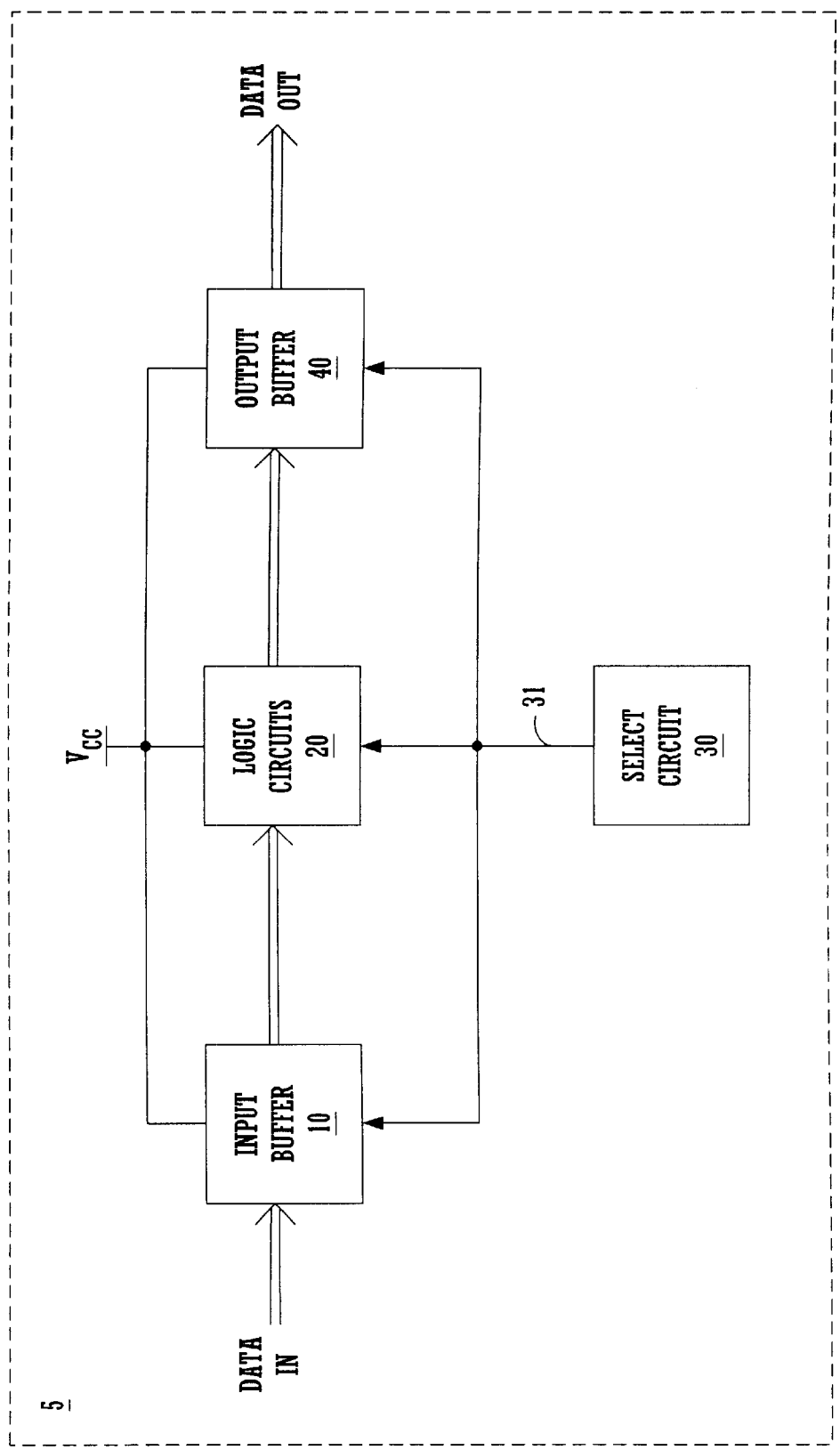
FIG. 1 illustrates an integrated circuit device according to one embodiment of the present invention.

Referring to the drawings in detail, wherein like numerals designate like parts and components, the following description sets forth numerous specific details in order to provide a thorough understanding of the present invention. However, after reviewing this specification, it will be apparent to those skilled in the art that the present invention may be practiced without some or all of these specific details. In other instances, well known circuit designs and techniques have not been described in detail in order not to unnecessarily obscure the present invention.

Referring to FIG. 1, a integrated circuit device 5 is shown. Integrated circuit (IC) device 5 includes an input buffer 10, logic circuits 20, a select circuit 30, and an output buffer 40. Integrated circuit device 5 may be incorporated within a computer system (for example as a memory device, a peripheral component, a controller, etc.). Input buffer 10 receives signals from other circuits or components that are external to integrated circuit device 5, and transmits the signals to logic circuits 20. Included with these signals may be instructions that indicate how the signals will be used. Responsive to the signals received from input buffer 10, logic circuits 20 may perform any number of operations. For example, logic circuits 20 may either write associated data to a storage location or read associated data from a storage location. If the input signals instruct logic circuits 20 to read data from a storage location, the resulting data is transmitted to output buffer 40. In one preferred embodiment, logic circuits 20 comprise a Static Random Access Memory (SRAM). However, one of ordinary skill in the art will recognize that logic circuits 20 may comprise other logic devices (such as Dynamic Random Access Memories (DRAMs), Programmable Logic Arrays (PLAs), etc.). Output buffer 40 receives data from logic circuits 20, and transmits the data to other components and/or circuits of the system of which IC device 5 is one component.

All of the components within integrated circuit device 5 are coupled to select circuit 30 by a select line 31. While in the preferred embodiment select circuit 30 is located within integrated circuit device 5, one skilled in the art will appreciate that select circuit 30 may be located within another circuit of a computer system. Select circuit 30 provides a select signal on select line 31, the select signal for causing input buffer 10, logic circuits 20 and/or output buffer 40 to operate according to a first or second state, depending on the state of the select signal. Also, select circuit 30 may provide select signals to other components that are not located within integrated circuit device 5. Preferably, select circuit 30 is configured such that one of two operating voltages (VCCs) may be specified (via the select signal) for integrated circuit device 5 operation. According to one embodiment of the present invention, VCCs of 3.3 volts and 5.0 volts are used. Nevertheless, one skilled in the art will recognize that other combinations of operating voltages may be used.

In the preferred embodiment, each component within integrated circuit device 5 is configured so that it is capable of operating at either 3.3 volts or 5.0 volts. In response to one or more select options, select circuit 30 generates a select signal (lv or hv) that is provided to all of the other components within integrated circuit device 5 via select line 31. The select signal indicates which operating voltage the components within integrated circuit device 5 will operate at. According to one embodiment, the select signal is a logic 0 (lv) when integrated circuit device 5 will operate at 3.3 volts, and a logic 1 (hv) when integrated circuit device 5 will operate at 5.0 volts.

Figure 2:
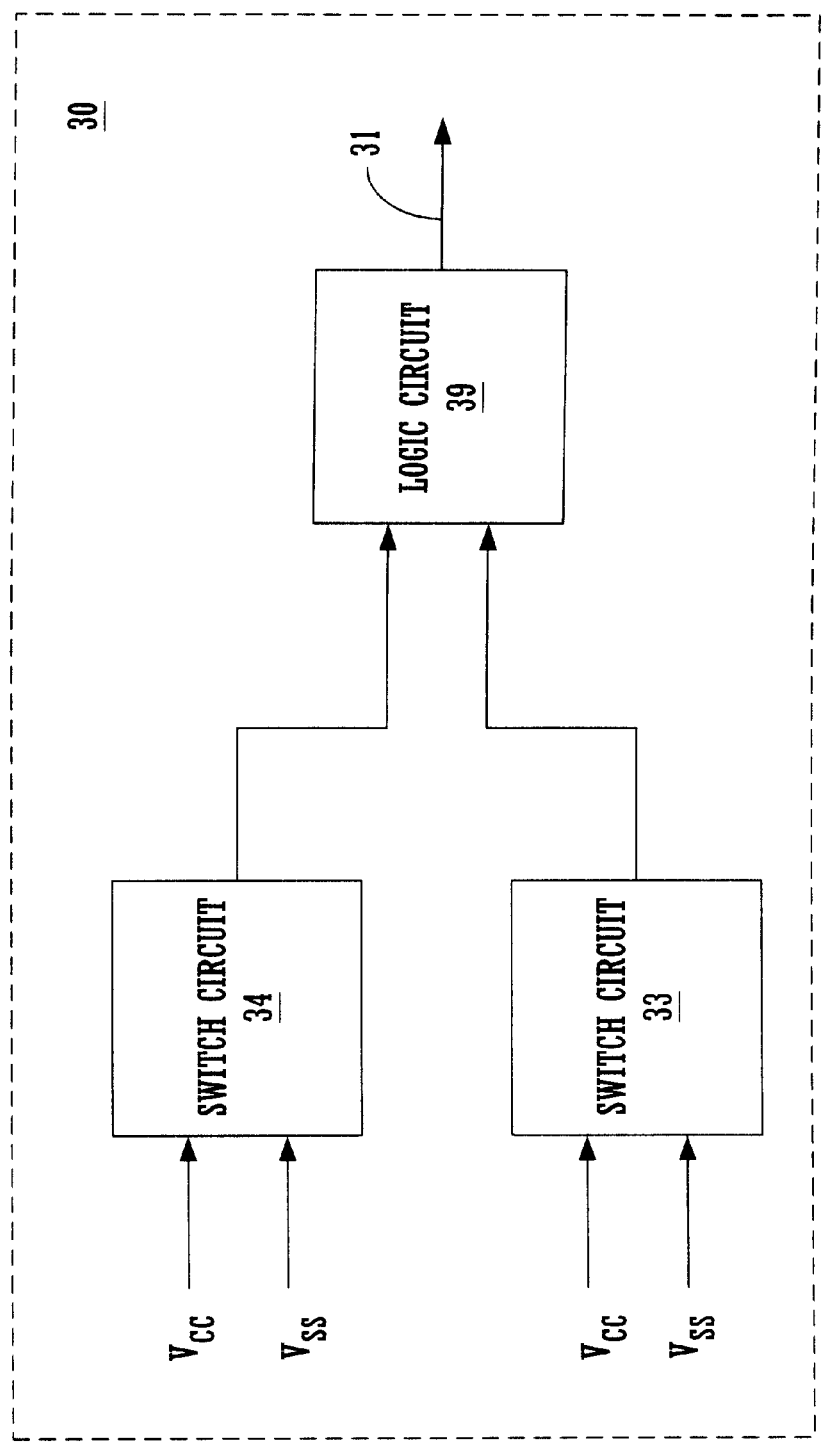
FIG. 2 illustrates a general configuration of a select circuit in accordance with one embodiment of the present invention.

FIG. 2 illustrates a general configuration of select circuit 30. Select circuit 30 includes switch circuit 33, switch circuit 34, and logic circuit 39. The input of logic circuit 39 is connected to switch circuits 33 and 34, while the output of logic circuit 39 is select line 31. Switch circuit 33 and switch circuit 34 both receive a VCC input and a ground (VSS) input. If switch circuit 33 is configured to select the VCC input, a logic 1 is transmitted to logic circuit 39. However, if switch circuit 33 is configured to select the VSS input, a logic 0 is transmitted to logic circuit 39. Similarly, switch circuit 34 transmits a logic 1 to logic circuit 39 if the VCC input is selected, while a logic 0 is transmitted if the VSS input is selected.

Figure 3:
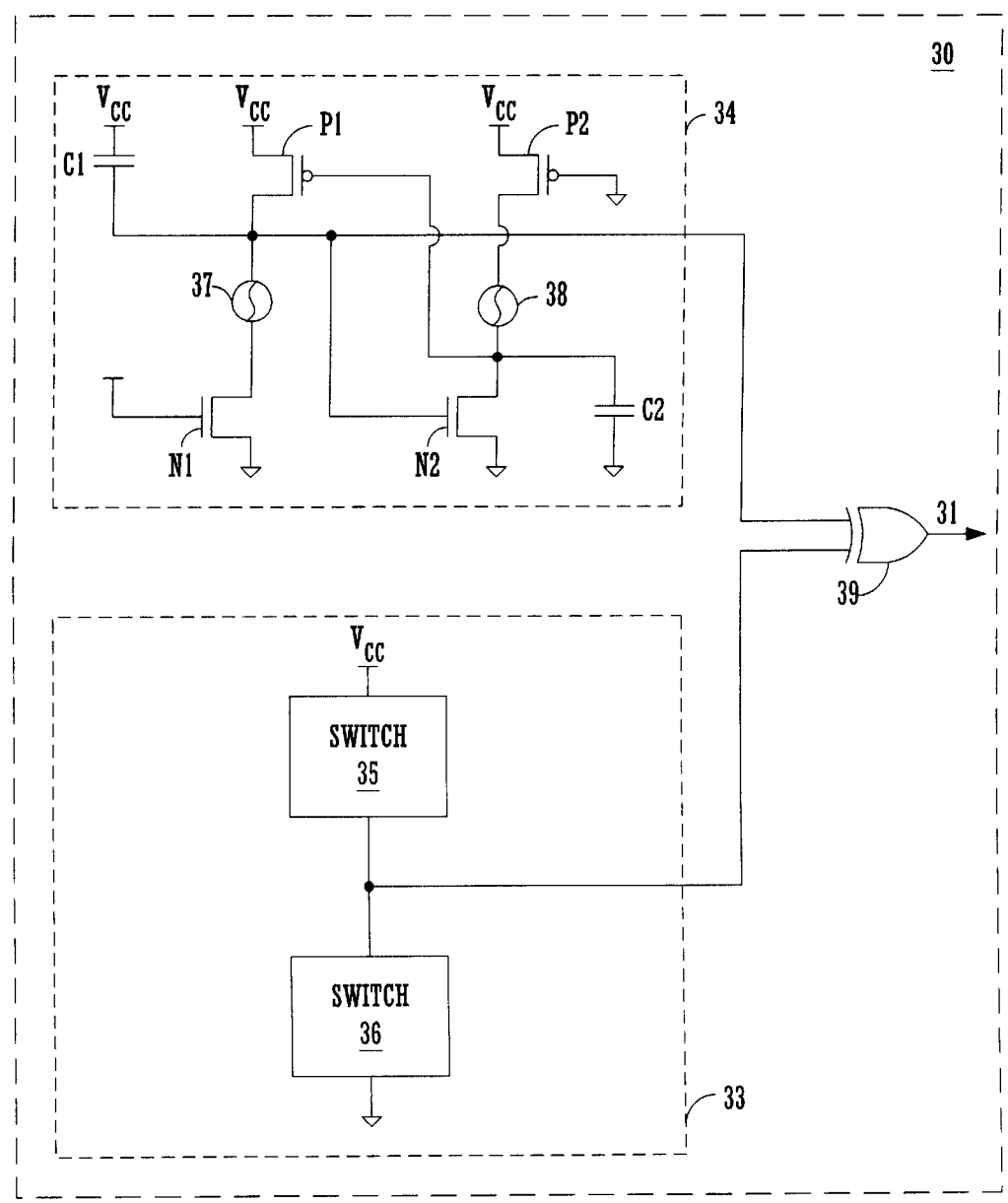
FIG. 3 illustrates a detailed configuration of the select circuit of FIG. 2.

Referring to FIG. 3, a more detailed configuration of select circuit 30 is illustrated. In the preferred embodiment, logic circuit 39 is an EXCLUSIVE OR gate. Accordingly, logic circuit 39 is configured such that a select signal hv is transmitted from select circuit 30 via select line 31 under the following conditions:

1. switch circuit 33 transmits a logic 1 and switch circuit 34 transmits a logic 0; or
2. switch circuit 33 transmits a logic 0 and switch circuit 34 transmits a logic 1.

A select signal lv is transmitted under the following conditions:

1. switch circuit 33 transmits a logic 0 and switch circuit 34 transmits a logic 0; or
2. switch circuit 33 transmits a logic 1 and switch circuit 34 transmits a logic 1.

One of ordinary skill in the art will recognize that other logic gate combinations may be used to achieve the overall function of logic circuit 39.

Switch circuit 33 includes switch 35 and switch 36. Switch 35 has an input connected to VCC and an output connected to logic circuit 39. Switch 36 also has an output coupled to logic circuit 39, but the input is coupled to VSS. Both switches are initially in the open position, with switch 35 representing a 5.0 volt operating voltage option and switch 36 representing a 3.3 volt operating voltage option. If selected, switch 35 is closed and VCC drives switch circuit 33 high, resulting in a logic 1 being transmitted to logic circuit 39. If, however, switch 36 is selected, VSS drives switch circuit 33 low. This results in a logic 0 being transmitted to logic circuit 39. According to one embodiment, switches 35 and 36 are metal mask options. However, one of ordinary skill in the art will recognize that other switching devices, e.g., transistors, may be used.

Figure 4:
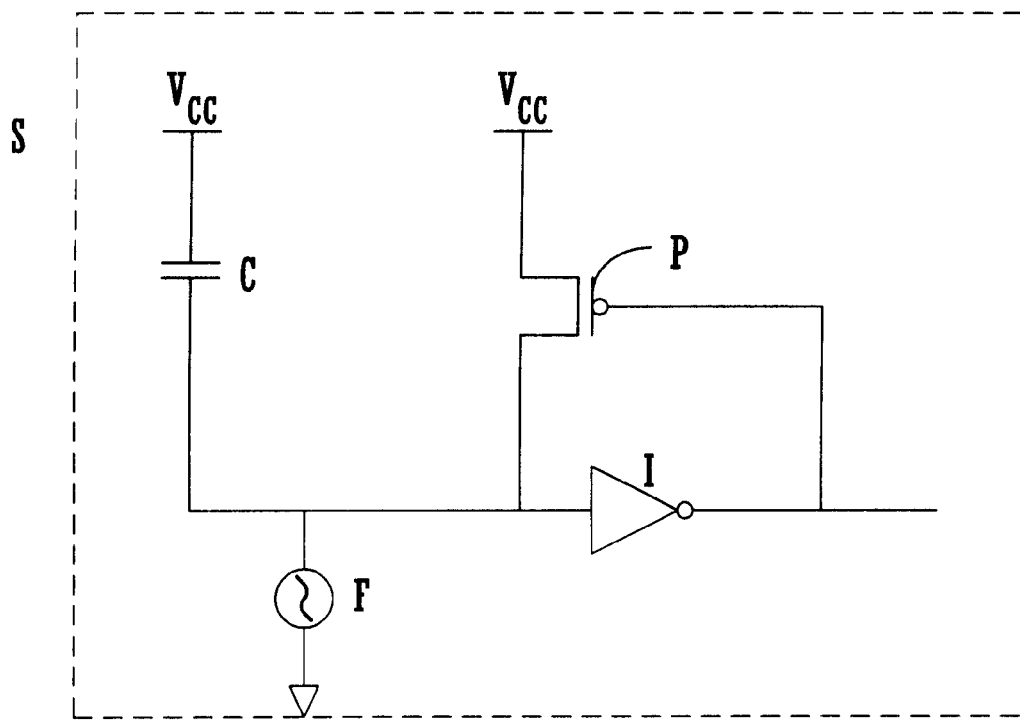
FIG. 4 illustrates an alternative embodiment of a switch circuit in accordance with a further embodiment of the present invention.

FIG. 4 illustrates an alternative embodiment in which switch circuit 33 comprises a single switch S. Switch S includes a capacitor C, a fuse F, an inverter I, and a PMOS transistor P. Capacitor C is coupled to VCC and the input of inverter I. Fuse F is coupled to ground and the input of inverter I. The gate of transistor P is coupled to the output of inverter I, and its source and drain regions are coupled to VCC and the input of inverter I, respectively. If fuse F is left intact, then on power up the input of inverter I is driven low to a logic 0, resulting in the output of inverter I being driven to a logic 1. Consequently, a logic 1 is transmitted from switch circuit 33 to logic circuit 39. If fuse F is blown, then on power up capacitor C will initially drive the input of inverter I high to a logic 1, resulting in the output of inverter I being driven to a logic 0. Transistor P is subsequently activated, causing the input of inverter I to remain high, and the output low. Accordingly, a logic 0 is transmitted from switch circuit 33 to logic circuit 39.

Referring back to FIG. 3, switch circuit 34 includes a fuse 37, a fuse 38, two capacitors (C1 and C2), two PMOS transistors (P1 and P2), and two NMOS transistors (N1 and N2). Fuse 37 is coupled to the drain of N1, to C1, to the drain of P1 and to the output of switch circuit 34. Fuse 38 is coupled to the drain of P2, to C2, to the drain of N2 and to the gate of P1. N1 and P2 are always activated since they have gates coupled to VCC and VSS, respectively. C1 and C2 initialize switch circuit 34 in order to ensure that it is in the proper condition if powered up when fuses 37 and 38 are blown. Thus, switch circuit 34 is self-setting. Furthermore, switch circuit 34 is configured in a manner such that zero power is consumed.

In the present embodiment, fuse 37 and fuse 38 are either both intact or both blown. If both fuses 37 and 38 are intact, upon power up current flows from VCC through P2 and fuse 38 and on to the gate of P1. This causes P1 to remain off.

Thus, no current flows through fuse 37 and the output of switch circuit 34 remains low. Accordingly, a logic 0 is transmitted to logic circuit 39. If both fuses 37 and 38 are blown, however, on power up capacitor C1 initially drives the output of switch circuit 34 high, causing a logic 1 to be transmitted to logic circuit 39. At the same time, capacitor C2 pulls the gate of P1 low so that P1 is activated. Thus, the output of switch circuit 34 is driven high to a logic 1 as current flows through P1 to the output of switch circuit 34.

Figure 5:
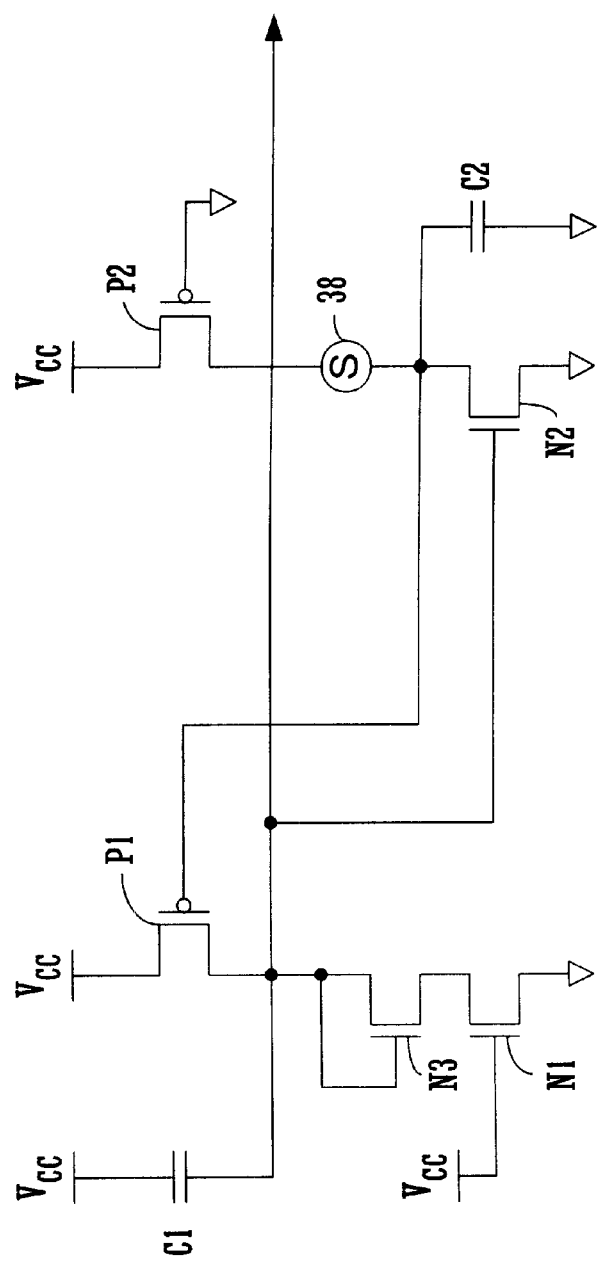
FIG. 5 illustrates an alternative embodiment of a switch circuit in accordance with yet another embodiment of the present invention.

In alternative embodiments switch circuit 34 may include only a single fuse. Referring to FIG. 5, fuse 37 is replaced with a third NMOS transistor (N3). The operation of switch circuit 34 remains essentially the same as described above, regardless of whether fuse 38 is blown or intact. One skilled in the art will recognize that other fuse configurations could be used to achieve the functionality of switch circuit 34.

During fabrication of integrated circuit 5, switch circuit 33 is configured such that either switch 35 or switch 36 is selected. Also, switch 34 is initially configured such that fuses 37 and 38 are intact. As mentioned above, switch 35 and switch 36 represent a choice of operating integrated circuit device 5 at 5.0 volts or 3.3 volts, respectively. At any time after one operating voltage option has been selected using switch circuit 33, fuses 37 and 38 may be blown in order to convert to the second operating voltage. For example, if switch 35 is selected during or after manufacture, logic circuit 39 receives a logic 1 from switch circuit 33 and a logic 0 (fuses unblown) from switch circuit 34. As described above, this would result in a select signal hv (representing the 5.0 volt operating voltage) being transmitted from select circuit 30 to other components within integrated circuit device 5 via select line 31.

If fuses 37 and 38 within switch circuit 34 are subsequently blown at any time after switch circuit 33 is so configured, switch circuit 34 will subsequently transmit a logic 1 to logic circuit 39. This will cause the select signal hv to be replaced with a select signal lv (representing the 3.3 volt operating voltage). Similarly, an initial select signal lv configuration of select circuit 30 (switch circuit 33=logic 0 and switch circuit 34=logic 0) would be converted to a select signal hv configuration (switch circuit 33=logic 0 and switch circuit 34=logic 1) after fuses 37 and 38 are blown. Fuses 37 and 38 may be blown during fabrication with a laser, or may be blown electrically after integrated circuit device 5 is packaged.

Figure 6:
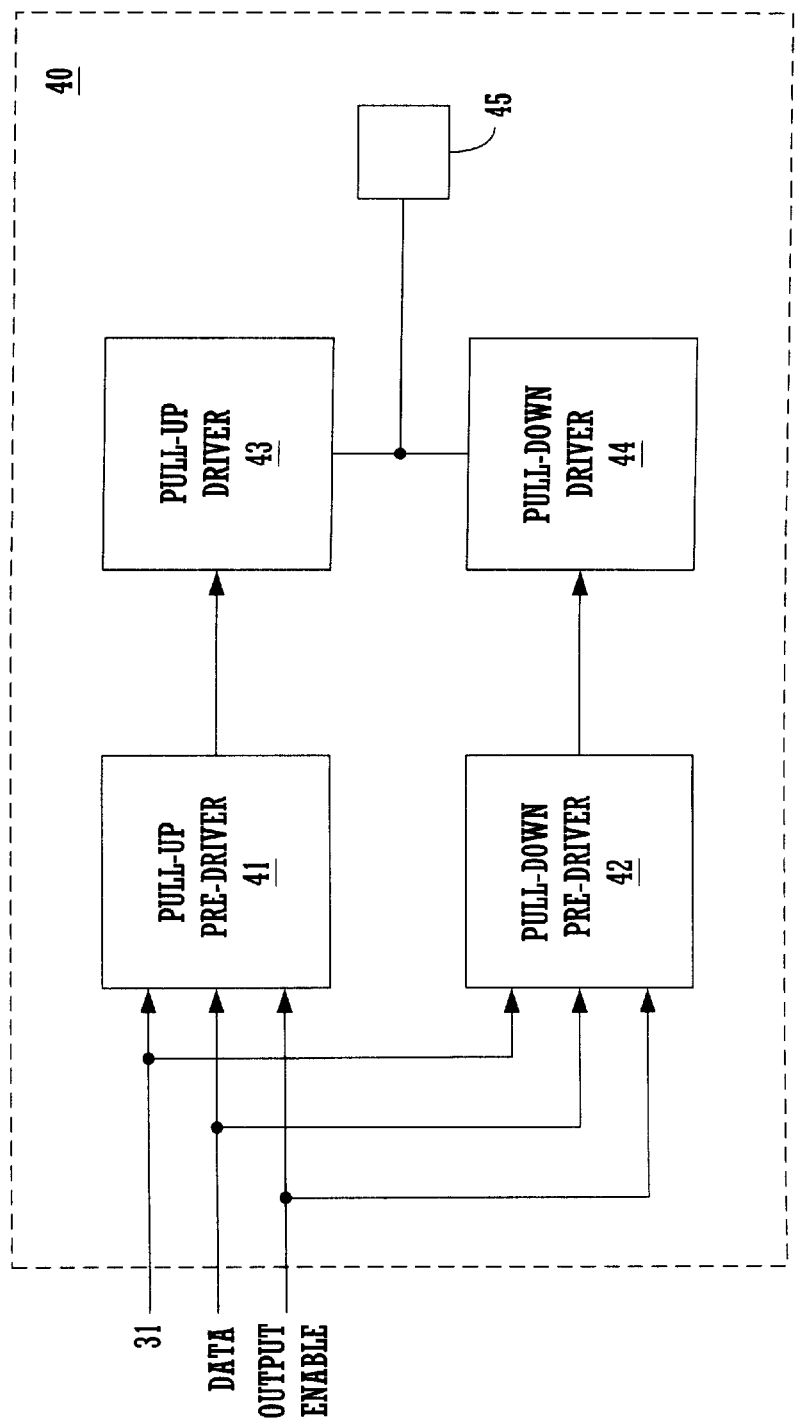
FIG. 6 illustrates a general configuration of an output buffer in accordance with an embodiment of the present invention.

Referring now to FIG. 6, a general configuration of output buffer 40 is shown. Output buffer 40 includes pull-up pre-driver 41, pull-down pre-driver 42, pull-up driver 43, pull-down driver 44, and output pad 45. Both pull-up pre-driver 41 and pull-down pre-driver 42 are connected to select line 31, a data line, and an output enable line. The data and output enable lines transmit a high or low signal that is transmitted from circuits that are external to output buffer 40. The function of pull-up pre-driver 41 and pull-up driver 43 is to pull the output of output buffer 40 high so that a logic 1 will be transmitted to output pad 45. The function of pull-down pre-driver 42 and pull-down driver 44 is to pull the output of output buffer 40 low so that a logic 0 will be transmitted to output pad 45. Output buffer 40 is configured such that it is capable of operating at either 3.3 volts or 5.0 volts. The operating voltage is determined by the select signal received from select circuit 30 over select line 31.

Figure 7:
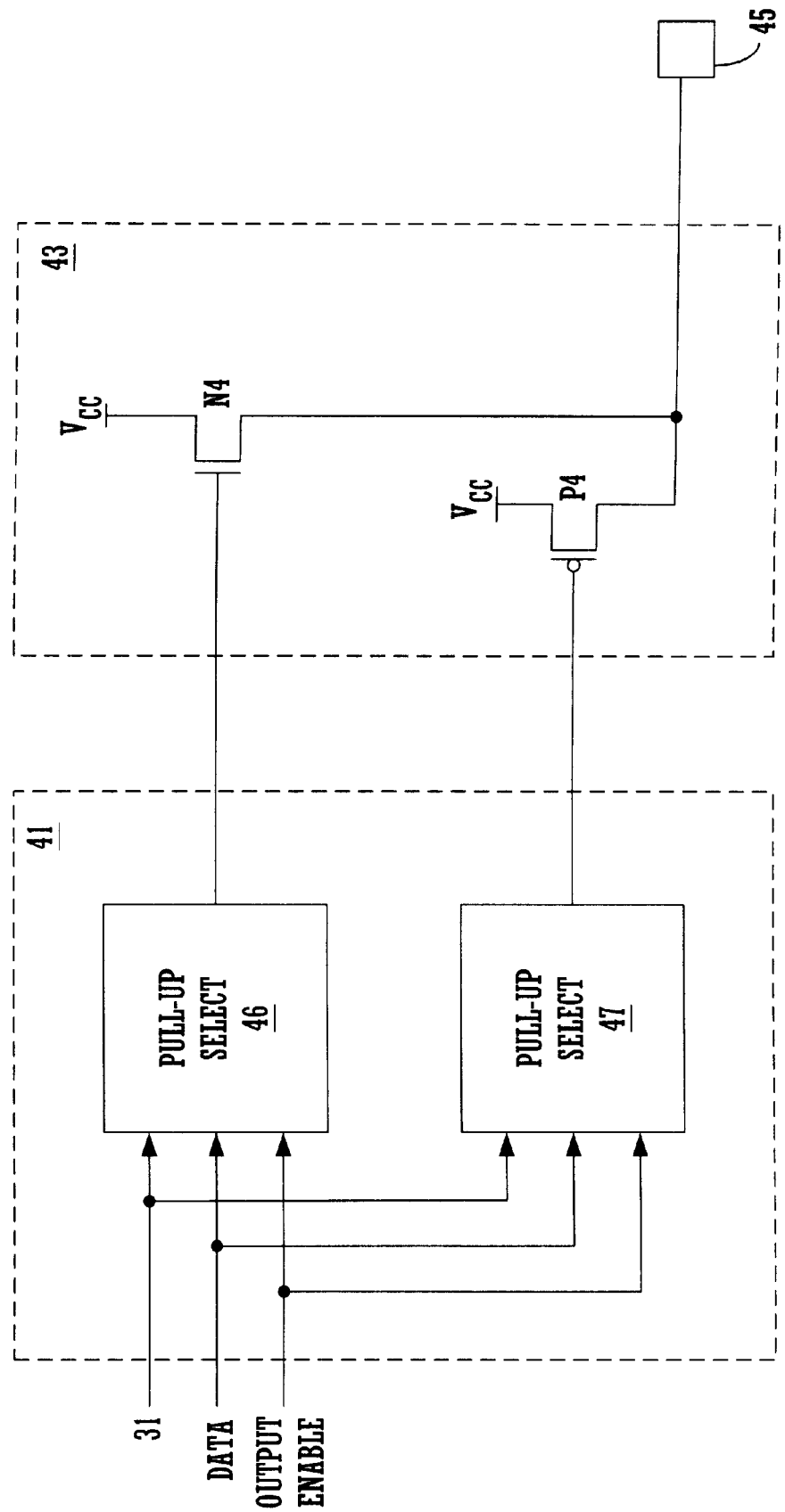
FIG. 7 illustrates a pull-up pre-driver in accordance with one embodiment of the present invention.

FIG. 7 illustrates a detailed configuration of pull-up pre-driver 41 and pull-up driver 43. Pull-up pre-driver 41 includes a pull-up select circuit 46 and a pull-up select circuit 47. Pull-up select circuit 46 and pull-up select circuit 47 are both connected to select line 31, the data line, and the output enable line. Pull-up driver 43 includes an NMOS transistor (N4) and a PMOS transistor (P4). Transistor N4 is used as the pull-up driver when output buffer 40 operates at 5.0 v, while transistor P4 is used for 3.3 v operation. The gate of transistor N4 is coupled to pull-up select circuit 46, while the gate of transistor P4 is coupled to pull-up select circuit 47. N4 and P4 are further coupled to VCC and output pad 45. Pull-up select circuit 46 is selected to operate pull-up pre-driver 41 whenever output buffer 40 is operating at 5.0 volts (i.e., select signal=hv), and pull-up select 47 is selected to operate pull-up pre-driver 41 whenever output buffer 40 is operating at 3.3 volts (i.e. select signal=lv). The output characteristics of pull-up driver 43, however, remain approximately the same regardless of the operating voltage being used. Thus, transistors N4 and P4 are configured so as to enable pull-up driver 43 to maintain an approximately constant slew rate while operating at either 3.3 or 5.0 volts.

If output buffer 40 is operating at 5.0 volts and both the data line and the output enable line are a logic 1, pull-up select circuit 46 is activated. Once pull-up select circuit 46 is activated, N4 is activated, thus VCC drives output pad 45 high to a logic 1. Similarly, If output buffer 40 is operating at 3.3 volts and both the data line and the output enable line are a logic 1, pull-up select circuit 47 is activated. Once pull-up select circuit 47 is activated, P4 is activated, in turn driving output pad 45 high to a logic 1.

Figure 8:
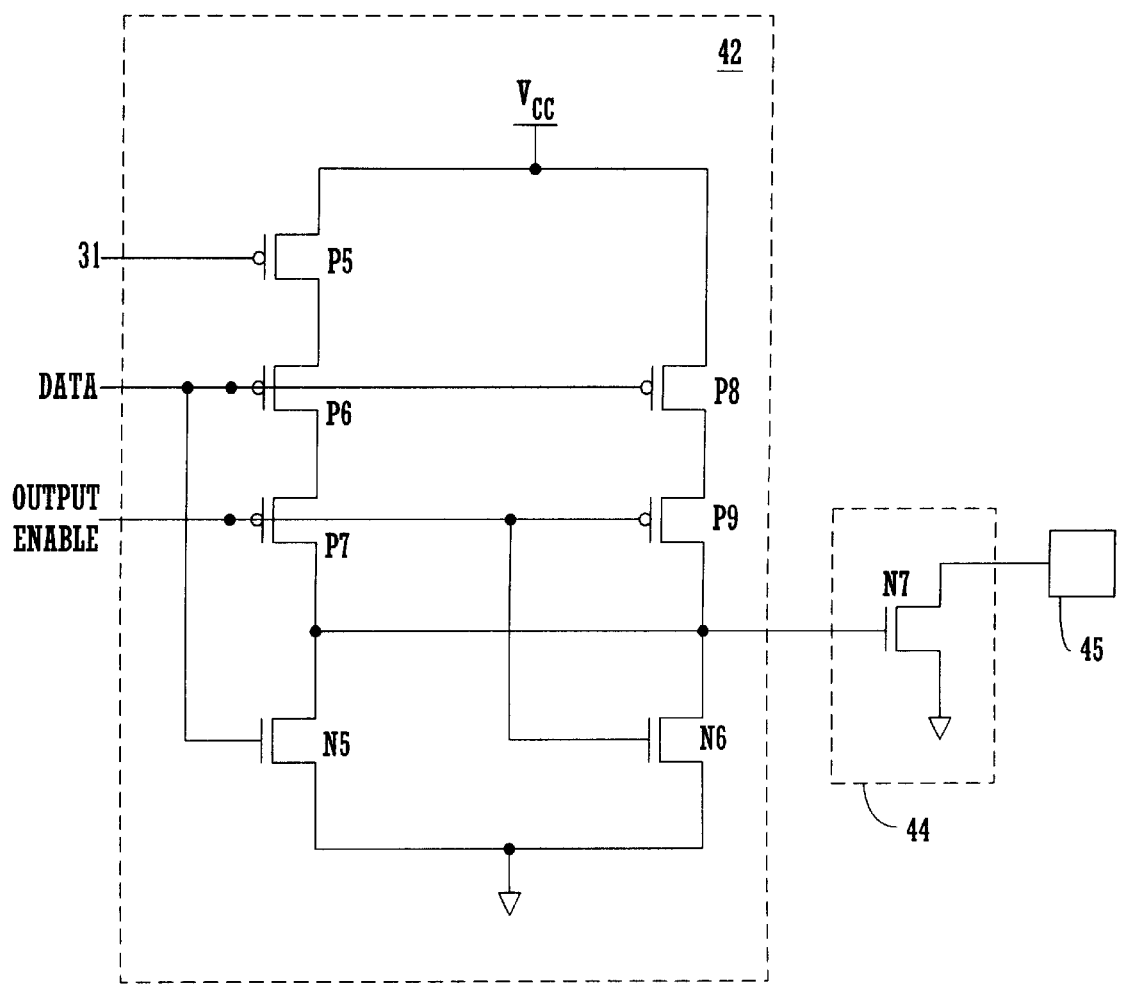
FIG. 8 illustrates a pull-down pre-driver and pull-down driver in accordance with one embodiment of the present invention.

Referring to FIG. 8, a detailed configuration of pull-down pre-driver 42 and pull-down driver 44 is illustrated. Pull-down pre-driver 42 includes two NMOS transistors (N5 and N6), and five PMOS transistors (P5–P9). The gate of P5 is coupled to select line 31; the gates of N5, P6 and P8 are coupled to the data line; and the gates of N6, P7 and P9 are coupled to the output enable line. The source and drain of P5 are connected to VCC and the source of P6, respectively. The drain of P6 is connected to the source of P7. The drain of P7 is connected to the source of N5, and to pull-down driver 44. The drain of N5 is connected to VSS. The source and drain of P8 are connected to VCC and the source of P9, respectively. The drain of P9 is connected to the source of N6, and to pull-down driver 44. The drain of N6 is connected to VSS.

Pull-down driver 44 comprises NMOS transistor (N7). The gate of N7 is coupled to the drains of P7 and P9, the source is coupled to output pad 45, and the drain is coupled to VSS. Transistors N5 and N6 are configured to drive the gate of N7 low, for example, while output pad 45 is being driven high by pull-up driver 43.

Pull-down pre-driver 42 and pull-down driver 44 operate to pull the output of output buffer 40 low so that a logic 0 will be transmitted to output pad 45. Accordingly, pull-down pre-driver 42 is activated when the data and output enable lines are at a logic 0. When the data line and the output enable line are a logic 0, P6–P9 are activated. If, in addition to the data and output enable lines being a logic 0, select line 31 is a logic 0 (i.e., output buffer 40 operating at 3.3 volts), P5 is activated. When transistor P5 is activated, current flows from VCC through P5, P6 and P7, on to the gate of transistor N7 of pulldown driver 44. In addition, current also flows from VCC through P8 and P9 to the gate of N7. Once transistor N7 is activated, output pad 45 is driven low to a logic 0. Thus, P5–P9 drive the gate of N7 when output buffer 40 operates at 3.3 volts.

If, in addition to the data and output enable lines being a logic 0, select line 31 is a logic 1 (i.e., output buffer 40 operating at 5.0 volts), transistor P5 remains off. In this instance no current flows through transistors P5, P6 and P7, even though P6 and P7 are activated. Nevertheless, current does flow from VCC through P8 and P9 to the gate of N7, driving output pad 45 low. Consequently, only transistors P8 and P9 drive the gate of transistor N7 when output buffer 40 operates at 5.0 volts.

In sum, when output buffer 40 is operating at 3.3 volts, transistors P5–P9 drive transistor N7, and when operating at 5.0 volts, transistors P8 and P9 drive transistor N7.

This function of pull-down pre-driver 42 enables output buffer 40 to selectively operate at different VCC levels without being too slow or generating too much ground bounce.

When output buffer 40 is operating at a low VCC (e.g., 3.3 volts), the transistors of pulldown pre-driver 42 are inherently slower. The drive to transistor N7 is increased by activating P5–P7, in addition to P8 and P9. However, when output buffer 40 is operating at a high VCC (e.g., 5.0 volts), where the output is inherently faster, there is no need to increase the drive to transistor N7. Increasing the drive to N7 would result in ground bounce generated by the output signal of output buffer 40. Ground bounce is controlled by using only P8 and P9 to drive transistor N7. Therefore, the slew rate and the amount of ground bounce of an output signal generated by output buffer 40 remains approximately the same regardless of the operating voltage.

Although the present invention has been described in terms of preferred embodiments, it will be appreciated that various modifications and alterations might be made by persons skilled in the art without departing from the spirit and scope of the invention. For example, select circuit 30 may be used for applications other than for voltage (e.g., to select the operation of another circuit such as an adder/subtractor). Therefore, the foregoing discussion should be regarded as illustrative only and the invention measured only in terms of the claims which follow.

What is claimed is:

1. An integrated circuit device comprising:
   an input circuit;
   logic circuitry coupled to the input circuit;
   an output circuit coupled to the logic circuitry;
   a select circuit coupled to the input circuit, output circuit and logic circuitry and including first and second switch circuits and a logic circuit coupled to each of the first and second switch circuits;
   said first switch circuit having a first switch and a second switch, wherein the first switch is a first metal mask option and the second switch is a second metal mask option; and
   the logic circuit configured to generate a select signal from a first signal transmitted from the first switch circuit and a second signal transmitted from the second switch circuit for causing the input circuit, output circuit and logic circuitry to operate between a first state and a second state.

2. An integrated circuit device comprising:
   an input circuit;
   logic circuitry coupled to the input circuit;
   an output circuit coupled to the logic circuitry;
   a select circuit coupled to the input circuit, output circuit and logic circuitry and including first and second switch circuits and a logic circuit coupled to each of the first and second switch circuits;
   said second switch circuit having a first fuse and a second fuse; and
   said logic circuit configured to generate a select signal from a first signal transmitted from said first switch circuit and a second signal transmitted from said second switch circuit for causing the input circuit, output circuit, and logic circuitry to operate between a first state and a second state.

3. The integrated circuit device of claim 2, wherein zero power is dissipated at the second switch circuit when the first fuse and the second fuse are blown.

4. An integrated circuit device comprising:
   an input circuit;
   logic circuitry coupled to the input circuit;
   an output circuit coupled to the logic circuitry;
   a select circuit coupled to the input circuit, output circuit and logic circuitry and including first and second switch circuits and a logic circuit coupled to each of the first and second switch circuits, wherein the logic circuit is an EXCLUSIVE OR gate; and
   said logic circuit configured to generate a select signal from a first signal transmitted from said first switch circuit and a second signal transmitted from said second switch circuit for causing the input circuit, output circuit, and logic circuitry to operate between a first state and a second state.

5. A select circuit within a system, the select circuit for generating a select signal for other circuits within the system to operate according to a first state or a second state, the select circuit comprising:
   a first switch circuit for generating a first signal which corresponds to the first state;
   a second switch circuit generating a second signal which corresponds to the second state; and
   a logic circuit coupled to receive the first and second signals and to produce the select signal by selecting either the first signal or the second signal.

6. The select circuit of claim 5, wherein the first switch circuit further comprises:
   a first switch; and
   a second switch.

7. The select circuit of claim 6, wherein the first switch is a first metal mask option and the second switch is a second metal mask option.

8. The select circuit of claim 7, wherein the second switch further comprises:
   a first fuse; and
   a second fuse.

9. The select circuit of claim 8, wherein zero power is dissipated by the second switch circuit when the first fuse and the second fuse are blown.

10. The select circuit of claim 5, wherein the logic circuit comprises an EXCLUSIVE OR gate.

11. The select circuit of claim 5, wherein the first state is a first voltage and the second state is a second voltage.

* * * * *